US012766566B2

(12) United States Patent
Maegawa

(10) Patent No.: US 12,766,566 B2
(45) Date of Patent: Oct. 20, 2026

(54) SUBSTRATE PROCESSING APPARATUS AND SUBSTRATE PROCESSING METHOD

(71) Applicant: SCREEN Holdings Co., Ltd., Kyoto (JP)

(72) Inventor: Tadashi Maegawa, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 113 days.

(21) Appl. No.: 18/686,823

(22) PCT Filed: Aug. 24, 2022

(86) PCT No.: PCT/JP2022/031852
§ 371 (c)(1),
(2) Date: Feb. 26, 2024

(87) PCT Pub. No.: WO2023/027100
PCT Pub. Date: Mar. 2, 2023

(65) Prior Publication Data
US 2024/0351074 A1 Oct. 24, 2024

(30) Foreign Application Priority Data
Aug. 26, 2021 (JP) ................................ 2021-138106

(51) Int. Cl.
*B08B 3/14* (2006.01)
*H10P 72/00* (2026.01)

(52) U.S. Cl.
CPC ............ *B08B 3/14* (2013.01); *H10P 72/0416* (2026.01)

(58) Field of Classification Search
CPC ............................... B08B 3/14; H10P 72/0416
USPC ........................................................... 134/84
See application file for complete search history.

(56) References Cited

U.S. PATENT DOCUMENTS

2013/0061888 A1* 3/2013 Sato .................. H01L 21/67248
134/95.2
2015/0020968 A1 1/2015 Kimura

FOREIGN PATENT DOCUMENTS

JP H11-283947 A 10/1999
JP 2003-059891 A 2/2003
JP 2005-064312 A 3/2005
JP 2007-201330 A 8/2007
JP 2008-130835 A 6/2008
(Continued)

OTHER PUBLICATIONS

JP2005064312A—machine translation (Year: 2005).*
(Continued)

*Primary Examiner* — Tinsae B Ayalew
(74) *Attorney, Agent, or Firm* — OSTROLENK FABER LLP

(57) ABSTRACT

A control unit supplies a discharge liquid used in a second half of washing process by a washing process unit to a washing process unit, and supplies the discharge liquid used in a second half of the washing process by the washing process unit to the washing process unit. Since the discharge liquid used in the washing process unit is reused in the washing process unit and the discharge liquid used in the washing process unit is reused in the washing process unit, a supply amount of pure water from a supply pipe to the washing process unit and the washing process unit can be reduced. Therefore, by recycling the pure water, a consumption amount of the pure water in the washing process can be reduced.

9 Claims, 8 Drawing Sheets

(56) References Cited

FOREIGN PATENT DOCUMENTS

| | | | |
|---|---|---|---|
| JP | 2009-110984 | A | 5/2009 |
| JP | 2010-027771 | A | 2/2010 |
| JP | 2013-254821 | A | 12/2013 |
| JP | 2018-022714 | A | 2/2018 |
| JP | 2020-102585 | A | 7/2020 |

OTHER PUBLICATIONS

JP2003059891A—machine translation (Year: 2003).*
International Search Report mailed Nov. 1, 2022 in corresponding PCT International Application No. PCT/JP2022/031852.
Written Opinion mailed Nov. 1, 2022 in corresponding PCT International Application No. PCT/JP2022/031852.

* cited by examiner

SUBSTRATE PROCESSING APPARATUS AND SUBSTRATE PROCESSING METHOD

CROSS-REFERENCE TO RELATED APPLICATIONS

The present application is a 35 U.S.C. §§ 371 national stage application of International Application No. PCT/JP2022/031852 filed Aug. 24, 2022, which claims priority to Japanese Patent Application No. 2021-138106, filed Aug. 26, 2021, the contents of which are incorporated herein by reference.

TECHNICAL FIELD

The present invention relates to a substrate processing apparatus and a substrate processing method of washing substrates such as a semiconductor substrate, a substrate for a flat panel display (FPD) such as a liquid crystal display or an organic electroluminescence (EL) display device, a glass substrate for a photomask, and a substrate for an optical disk.

BACKGROUND ART

Conventionally, as this type of device, there is a device including a chemical solution tank that performs processing with a chemical solution and a pure water tank that performs processing with pure water (see, for example, Patent Literature 1). In addition, in order to improve throughput, a plurality of sets of the chemical solution tank and the pure water tank are provided, for example, two sets such as a chemical solution tank (CHB1) and a pure water tank (ONB1), and a chemical solution tank (CHB2) and a pure water tank (ONB2) (see, for example, Patent Literature 2).

Each pure water tank is supplied with pure water from a pure water supply source. The pure water supplied to the pure water tank and overflowed from the pure water tank is directly discarded. That is, the pure water tank is always supplied with clean pure water from the pure water supply source. In other words, washing process on a substrate is always performed only with clean and new pure water.

The substrate to be processed in the pure water tank is, for example, a substrate that has been subjected to processing with the chemical solution in the chemical solution tank. Therefore, at a time point when the substrate is immersed in the pure water in the pure water tank, the chemical solution or the like adhering to the substrate exists in a large amount in the pure water in the pure water tank, and therefore, the pure water has a low specific resistance value. As the washing process proceeds in the pure water tank, the chemical solution or the like in the pure water in the pure water tank are discharged from the pure water tank together with the pure water. Therefore, the concentration of the chemical solution or the like decreases, and the specific resistance value of the pure water in the pure water tank increases. When a certain period of time elapses, the specific resistance value of the pure water stops increasing, and the specific resistance value of the pure water in the pure water tank is saturated at a value close to a maximum specific resistance value theoretically obtained for the pure water. This time point is generally a completion time of the washing process.

This completion time can be determined in advance, for example, by measuring a change in the specific resistance value of the pure water in the pure water tank from a time point when the substrate subjected to predetermined chemical solution processing is immersed while a predetermined flow rate of pure water is being supplied, and measuring a time until the specific resistance value is saturated.

CITATION LIST

Patent Literature

Patent Literature 1: JP 11-283947 A (FIG. 3)
Patent Literature 2: JP 2010-27771 A (FIG. 1)

SUMMARY OF INVENTION

Technical Problem

However, the conventional example having such a configuration has the following problem.

That is, in the conventional apparatus, clean pure water is supplied to each pure water tank, and the pure water used for the washing process is discarded. Therefore, there is a problem that a consumption amount of pure water in the washing process becomes significantly large. In particular, the problem is remarkable in a substrate processing apparatus including a plurality of pure water tanks in improving throughput.

The present invention has been made in view of such circumstances, and an object of the present invention is to provide a substrate processing apparatus and a substrate processing method capable of reducing a consumption amount of pure water in washing process by recycling the pure water.

Solution to Problem

In order to achieve such an object, the present invention has the following configuration.

That is, the invention according to claim 1 is a substrate processing apparatus that performs washing process on a substrate, the substrate processing apparatus including a first processing tank configured to accommodate the substrate, a second processing tank configured to accommodate the substrate, a first pure water supply pipe that is communicably connected to a pure water supply source and supplies pure water to the first processing tank, a first supply valve inserted into the first pure water supply pipe, a second pure water supply pipe that is communicably connected to the pure water supply source and supplies the pure water to the second processing tank, a second supply valve inserted into the second pure water supply pipe, a first recycling pipe that supplies a discharge liquid discharged from the first processing tank to the second processing tank, a first recycling valve inserted into the first recycling pipe, and a control unit that controls opening and closing of the first supply valve, the second supply valve, and the first recycling valve.

[Operation and effects] In the invention according to claim 1, the control unit controls opening and closing of the first supply valve, the second supply valve, and the first recycling valve, and supplies the discharge liquid supplied from the first pure water supply pipe to the first processing tank and used for the washing process to the second processing tank through the first recycling pipe. Since the discharge liquid used in the first processing tank is reused in the second processing tank, a supply amount of the pure water from the second pure water supply pipe to the second processing tank can be reduced. Therefore, by recycling the pure water, a consumption amount of the pure water in the washing process can be reduced.

Here, the discharge liquid is a liquid containing pure water. The discharge liquid contains a chemical solution in the pure water. The discharge liquid has a lower cleanliness than pure water having been just supplied from the pure water supply source. The discharge liquid has a specific resistance value than pure water having been just supplied from the pure water supply source.

The present invention preferably further includes a second recycling pipe that supplies the discharge liquid discharged from the second processing tank to the first processing tank, and a second recycling valve inserted into the second recycling pipe, in which the control unit further controls opening and closing of the second recycling valve (claim 2).

The control unit supplies the discharge liquid supplied to the second processing tank and used for the washing process to the first processing tank through the second recycling pipe. Since the discharge liquid used in the second processing tank is reused for the first processing tank, a supply amount of the pure water from the first pure water supply pipe to the first processing tank can be reduced. Therefore, the consumption amount of the pure water in the washing process can be further reduced.

In the present invention, the control unit preferably manages the substrate to be subjected to the washing process in lots, and when a first lot is cleaned in the first processing tank and a second lot is cleaned in the second processing tank, at least a part of the discharge liquid discharged from the first processing tank in a second half of the washing process of the first lot is supplied to the second processing tank through the first recycling pipe in a first half of the washing process of the second lot (claim 3).

When the first lot is subjected to the washing process in the first processing tank and the second lot is subjected to the washing process in the second processing tank, the specific resistance value of the discharge liquid in the first processing tank is high in the second half of the washing process of the first lot. In other words, the cleanliness of the discharge liquid is higher in the second half of the washing process of the first lot than in the first half of the washing process. On the other hand, in the first half of the washing process of the second lot, a large amount of impurities and the like attached to the substrate are contained in the discharge liquid, and thus, the specific resistance value of the discharge liquid is low. In other words, the first half of the washing process of the second lot is in a contaminated state in which the cleanliness of the discharge liquid is lower than in the second half of the washing process. Therefore, the first recycling pipe supplies the second processing tank with the discharge liquid discharged from the first processing tank in the second half of the washing process having higher cleanliness than the first half of the washing process, and the discharge liquid is used in the first half of the washing process of the second lot. As a result, even if the discharge liquid used for the washing process is reused for the second lot, the discharge liquid can be processed without adversely affecting the washing process.

Note that the cleanliness of the discharge liquid is lower in the first half of the washing process than in the second half of the washing process. In the first half of the washing process, the specific resistance value is low. In other words, the cleanliness of the discharge liquid is higher in the second half of the washing process than in the first half of the washing process. In the second half of the washing process, the specific resistance value is high. Therefore, the first half and the second half here do not mean a temporal half in terms of time at which the washing process is completed. The first half and the second half correspond to the cleanliness of the discharge liquid, and are determined in accordance with whether the cleanliness is enough for reusability for the washing process.

In the present invention, the control unit preferably manages the substrate to be subjected to the washing process in lots, and when a first lot is cleaned in the first processing tank and a second lot is cleaned in the second processing tank, at least a part of the discharge liquid discharged from the first processing tank in a second half of the washing process of the first lot is preferably supplied to the second processing tank through the first recycling pipe in a first half of the washing process of the second lot, and at least a part of the discharge liquid discharged from the second processing tank in the second half of the washing process of the second lot is preferably supplied to the first processing tank through the second recycling pipe in the first half of the washing process of a third lot that is subsequently processed in the first processing tank after the first lot (claim 4).

When the first lot is subjected to the washing process in the first processing tank and the second lot is subjected to the washing process in the second processing tank, the specific resistance value of the pure water in the first processing tank is high in the second half of the washing process of the first lot. In other words, the cleanliness of the discharge liquid is higher in the second half of the washing process of the first lot than in the first half of the washing process. On the other hand, in the first half of the washing process of the second lot, a large amount of impurities and the like attached to the substrate are contained in the discharge liquid, and thus, the specific resistance value of the discharge liquid is low. In other words, the first half of the washing process of the second lot is in a contaminated state in which the cleanliness of the discharge liquid is lower than in the second half of the washing process. Therefore, the first recycling pipe supplies the second processing tank with the discharge liquid discharged from the first processing tank in the second half of the washing process having higher cleanliness than the first half of the washing process, and the discharge liquid is used in the first half of the washing process of the second lot. Similarly, in the second half of the washing process of the second lot, the discharge liquid discharged from the second processing tank is supplied to the first processing tank by the second recycling pipe, and is used in the first half of the washing process of the third lot which is subsequently processed after the first lot. As a result, even if the discharge liquid used for the washing process is reused for the first lot and the second lot, the discharge liquid can be processed without adversely affecting the washing process.

In the present invention, the first processing tank preferably includes a first inner tank configured to accommodate the substrate, a first ejection pipe that is provided at a bottom of the first inner tank and ejects the pure water upward, and a first outer tank into which the discharge liquid overflowing from an upper edge of the first inner tank flows, the first pure water supply pipe is preferably communicably connected to the first ejection pipe and the second recycling pipe, the second processing tank preferably includes a second inner tank configured to accommodate the substrate, a second ejection pipe that is provided at a bottom of the second inner tank and ejects the pure water upward, and a second outer tank into which the discharge liquid overflowing from an upper edge of the second inner tank flows, and the second pure water supply pipe is preferably communicably connected to the second ejection pipe and the first recycling pipe (claim 5).

The first pure water supply pipe is communicably connected to the first ejection pipe and the second recycling pipe. The second pure water supply pipe is communicably connected to the second ejection pipe and the first recycling pipe. Therefore, since the recycled discharge liquid is supplied from the first ejection pipe and the second ejection pipe to the first processing tank and the second processing tank, the recycled discharge liquid can be suitably supplied to the substrate.

In the present invention, the second half of the washing process of the first lot is preferably at or after a time point at which a specific resistance value exceeds 0.5 MΩ·cm to 1 MΩ·cm from a start of the washing process (claim 6).

When the specific resistance value exceeds 0.5 MΩ·cm to 1 MΩ·cm, the washing process is not adversely affected by the reuse of the discharge liquid.

In the present invention, the control unit preferably does not supply the discharge liquid discharged from the first processing tank to the second processing tank and supplies the pure water from the second pure water supply pipe to the second processing tank in the second half of the washing process of the second lot (claim 7).

In the second half of the washing process in the second processing tank, the control unit does not supply the discharge liquid discharged from the first processing tank to the second processing tank, and supplies pure water from the second pure water supply pipe communicably connected to the second processing tank to the second processing tank. That is, the control unit does not reuse the discharge liquid by the first recycling pipe. Therefore, washing of the substrate can be completed in a clean state.

In the present invention, the control unit preferably supplies a mixture of at least a part of the discharge liquid discharged from the first processing tank and the pure water flowing through the second pure water supply pipe to the second processing tank in the first half of the washing process of the second lot, and supplies a mixture of at least a part of the discharge liquid discharged from the second processing tank and the pure water flowing through the first pure water supply pipe to the first processing tank in the first half of the washing process of the third lot (claim 8).

In the first half of the washing process of the second lot, at least a part of the discharge liquid discharged from the first processing tank is mixed with pure water flowing through the second pure water supply pipe and supplied to the second processing tank. In the first half of the washing process of the third lot, at least a part of the discharge liquid discharged from the second processing tank is mixed with pure water flowing through the first pure water supply pipe and supplied to the first processing tank. It is therefore possible to the supply pure water and discharge liquid in amounts necessary for the washing process.

In the present invention, the first recycling pipe preferably includes a buffer tank (claim 9), and the second recycling pipe preferably includes a buffer tank.

The first recycling pipe (second recycling pipe) includes a buffer tank. It is therefore possible to provide a margin for a supply timing of the discharge liquid to be supplied from the first recycling pipe (second recycling pipe) to the second processing tank (first processing tank). As a result, when the first lot and the second lot are introduced into the first processing tank and the second processing tank, even if the second half of the washing process in the first lot is deviated from the first half of the washing process in the second lot, the discharge liquid can be suitably reused.

The invention is directed to a substrate processing method of performing washing process on a substrate, the method including, when the substrate to be subjected to the washing process is managed in lots, starting the washing process on a first lot in a first processing tank configured to accommodate the substrate, and starting the washing process on a second lot in a second processing tank configured to accommodate the substrate after starting the washing process on the first lot, in which when the starting of the washing process on the first lot and the starting of the washing process on the second lot are executed sequentially, at least a part of the discharge liquid discharged from the first processing tank is supplied to the second processing tank.

[Operation and effects] In the invention, since the discharge liquid used in the first processing tank is reused for the second processing tank, a supply amount of the pure water to the second processing tank can be reduced. Therefore, by recycling the pure water, a consumption amount of the pure water in the washing process can be reduced.

In the present invention, when the washing process is started on a third lot to be processed in the first processing tank subsequently after the first lot in the first processing tank after the washing process of the second lot is started, at least a part of the discharge liquid discharged from the second processing tank is preferably supplied to the first processing tank.

Since the discharge liquid used in the second processing tank is reused for the first processing tank, a supply amount of the pure water to the first processing tank can be reduced. Therefore, the consumption amount of the pure water in the washing process can be further reduced.

Advantageous Effects of Invention

In the substrate processing apparatus of the present invention, the control unit controls opening and closing of the first supply valve, the second supply valve, and the first recycling valve, and supplies the discharge liquid supplied from the first pure water supply pipe to the first processing tank and used for the washing process to the second processing tank through the first recycling pipe. Since the discharge liquid used in the first processing tank is reused in the second processing tank, a supply amount of the pure water from the second pure water supply pipe to the second processing tank can be reduced. Therefore, by recycling the pure water, a consumption amount of the pure water in the washing process can be reduced.

DESCRIPTION OF EMBODIMENTS

Hereinafter, an embodiment of the present invention will be described with reference to the drawings.

Figure 1:
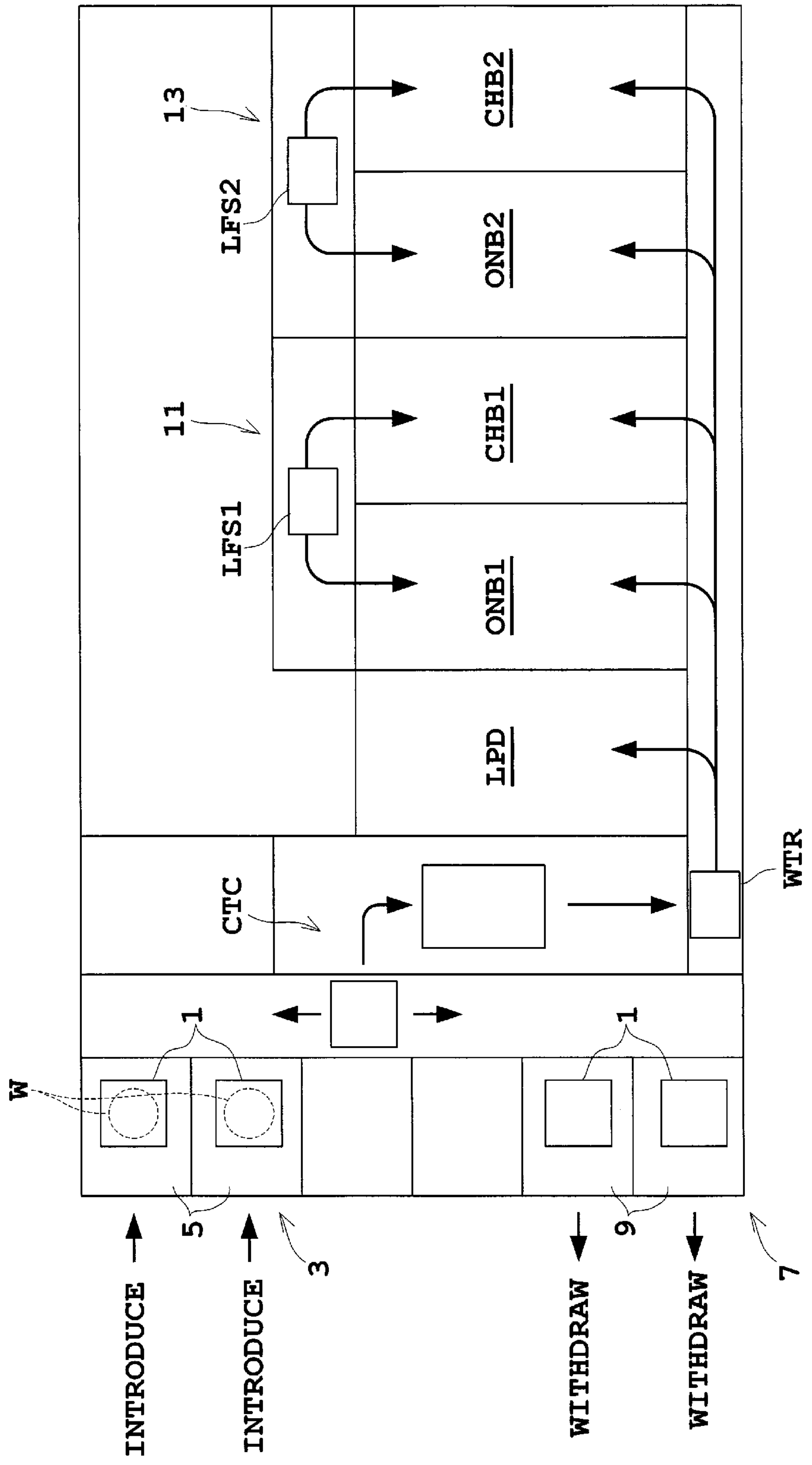
FIG. 1 is a plan view illustrating a schematic configuration of a substrate processing apparatus according to an embodiment.
Figure 2:
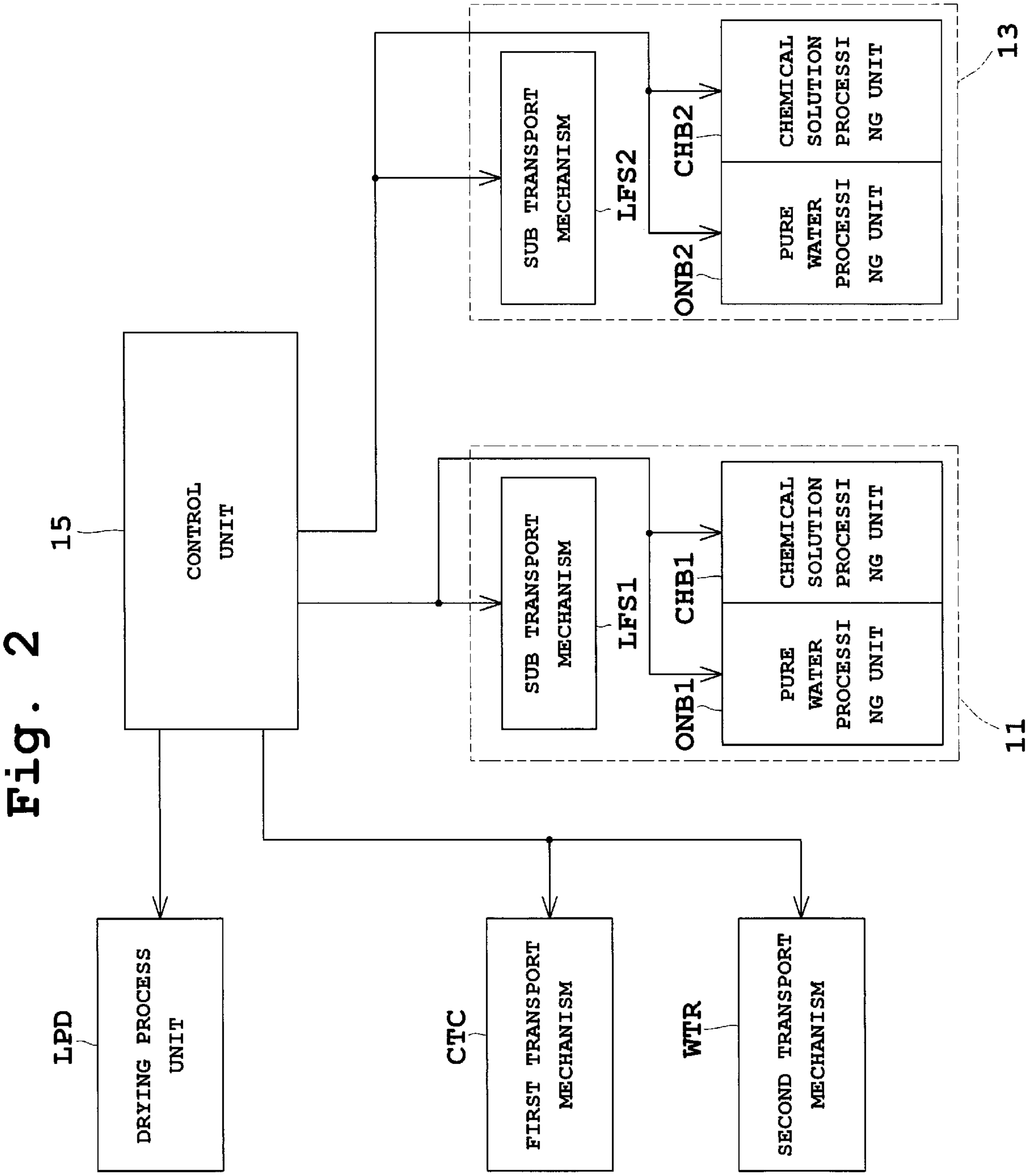
FIG. 2 is a plan view illustrating a schematic configuration of the substrate processing apparatus according to the embodiment.

FIG. 1 is a plan view illustrating a schematic configuration of a substrate processing apparatus according to the embodiment. FIG. 2 is a plan view illustrating a schematic configuration of the substrate processing apparatus according to the embodiment.

1. Configuration of Apparatus

The substrate processing apparatus according to the embodiment is, for example, an apparatus for performing chemical solution processing, washing process, and drying process on a substrate W. A plurality of (for example, 25) substrates W are stacked and accommodated in a cassette 1 in a horizontal orientation. The cassette 1 storing an unprocessed substrate W is placed on an introducing unit 3. The introducing unit 3 includes two placing tables 5 on which the cassette 1 is placed.

A withdrawing unit 7 is disposed on the opposite side of the introducing unit 3 across a center of the substrate processing apparatus. The withdrawing unit 7 accommodates a processed substrate W in the cassette 1 and withdraws the substrate W together with the cassette 1. Similarly to the introducing unit 3, the withdrawing unit 7 functioning in such a manner includes two placing tables 9 for placing the cassette 1.

A first transport mechanism CTC configured to be movable between the introducing unit 3 and the withdrawing unit 7 is provided at a position along the introducing unit 3 and the withdrawing unit 7. The first transport mechanism CTC takes out all the substrates W accommodated in the cassette 1 placed on the introducing unit 3, and then transports the substrates W to a second transport mechanism WTR. After receiving the processed substrate W from the second transport mechanism WTR, the first transport mechanism CTC accommodates the substrate W in the cassette 1. The second transport mechanism WTR is configured to be movable along a longitudinal direction of the substrate processing apparatus.

A drying process unit LPD for storing and drying the plurality of substrates W in a low-pressure chamber is provided closer to the withdrawing unit 7 in a moving direction of the second transport mechanism WTR.

A first processing unit 11 is disposed at a position adjacent to the drying process unit LPD in the moving direction of the second transport mechanism WTR.

The first processing unit 11 includes a washing process unit ONB1 and a chemical solution processing unit CHB1. The washing process unit ONB1 performs washing process on the substrate W with pure water. The chemical solution processing unit CHB1 performs chemical solution processing on the substrate W with a processing solution including a chemical solution. The first processing unit 11 includes a sub transport mechanism LFS1. The sub transport mechanism LFS1 delivers the substrate W to and from the second transport mechanism WTR. The sub transport mechanism LFS1 is configured to be movable between the pure water processing unit ONB1 and the chemical solution processing unit CHB1. The sub transport mechanism LFS1 can be ascended and descended only by the pure water processing unit ONB1 and the chemical solution processing unit CHB1.

A second processing unit 13 is provided at a position adjacent to the first processing unit 11. The second processing unit 13 has a configuration similar to the configuration of the first processing unit 11 described above.

That is, the second processing unit 13 includes a washing process unit ONB2, a chemical solution processing unit CHB2, and a sub transport mechanism LFS2. The washing process unit ONB2 has a configuration similar to the configuration of the washing process unit ONB1 described above. The chemical solution processing unit CHB2 has a configuration similar to the configuration of the chemical solution processing unit CHB1 described above. The sub transport mechanism LFS2 has a configuration similar to the configuration of the sub transport mechanism LFS1 described above.

A control unit 15 integrally controls each unit such as the first transport mechanism CTC described above. A control unit 25 includes a CPU and a memory. The memory of the control unit 25 handles the substrates W as lots, and stores in advance a recipe or the like defining how to process each lot in the first processing unit 11 or the second processing unit 13. The recipe describes in advance, for example, the flow rate of pure water to be supplied to the inner tank 19, time for immersing the substrate W in the inner tank 19, and the like.

Figure 3:
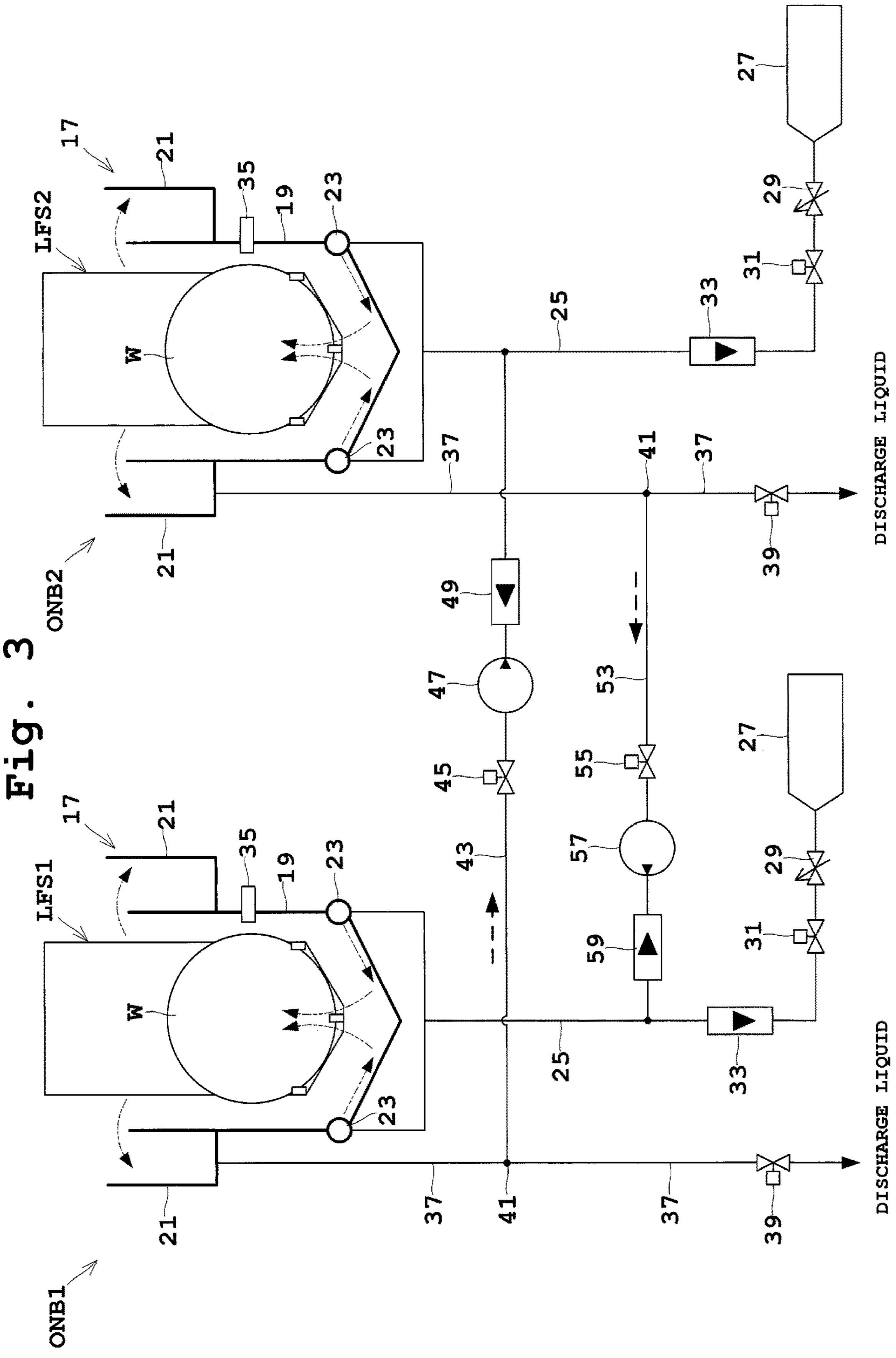
FIG. 3 is a diagram illustrating a washing process unit in the substrate processing apparatus.

Here, reference is made to FIG. 3. FIG. 3 is a diagram illustrating the washing process unit in the substrate processing apparatus.

The washing process unit ONB1 includes a processing tank 17. The processing tank 17 includes an inner tank 19 and an outer tank 21.

The inner tank 19 can accommodate the substrate W together with the sub transport mechanism LFS1. The inner tank 19 includes ejection pipes 23 on both sides of a bottom of the inner tank 19. The ejection pipe 23 has a long axis in a backward front direction in FIG. 3, and a plurality of injection ports (not illustrated) is formed along the long axis. The outer tank 21 is provided on an outer periphery of an upper edge of the inner tank 19. The outer tank 21 recovers pure water supplied from the ejection pipe 23 to the inner tank 19 and overflowed from the upper edge of the inner tank 19.

One end of the supply pipe 25 is communicably connected to the ejection pipe 23. The other end of the supply pipe 25 is communicably connected to a pure water supply source 27. The pure water supply source 27 supplies pure water having a specific resistance value of about a theoretical value (16 MΩ·cm). The supply pipe 25 includes a flow rate regulating valve 29, an on-off valve 31, and a flowmeter 33 from a position closer to the pure water supply source 27 toward the ejection pipe 23.

The flow rate regulating valve 29 adjusts the flow rate of pure water flowing through the supply pipe 25. The on-off valve 31 switches the flow of pure water in the supply pipe 25 between an allowing state and a blocking state. The flowmeter 33 measures a flow rate of pure water flowing through the supply pipe 25. The measured flow rate is output to the control unit 15.

A resistivity meter 35 is attached to one side surface of the inner tank 19. The resistivity meter 35 measures a specific resistance value of the pure water stored in the inner tank 19. The measured specific resistance value is output to the control unit 15.

The outer tank 21 includes a discharge pipe 37. Specifically, one end of the discharge pipe 37 is communicably connected to a bottom surface of the outer tank 21. The discharge pipe 37 discharges discharge liquid from the other end. The discharge liquid is pure water containing particles separated from the substrate W and a part of the chemical solution washed away from the substrate W. The discharge liquid may be only pure water containing substantially no impurities. The discharge pipe 37 includes an on-off valve 39. The on-off valve 39 controls discharge of the discharge liquid. That is, the on-off valve 39 allows the flow of the discharge liquid or blocks the flow of the discharge liquid. The discharge pipe 37 is provided with a branching portion 41 between the outer tank 21 and the on-off valve 39.

The washing process unit ONB1 is configured as described above. The washing process unit ONB2 of the second processing unit 13 is configured similarly to the washing process unit ONB1 described above.

The washing process unit ONB1 includes a recycling pipe 43. One end of the recycling pipe 43 is communicably connected to the branching portion 41. The other end of the recycling pipe 43 is communicably connected to the supply pipe 25 of the washing process unit ONB2.

Specifically, the other end of the recycling pipe 43 is communicably connected between the flowmeter 33 and the ejection pipe 23 of the washing process unit ONB2. The recycling pipe 43 includes an on-off valve 45, a pump 47, and a flowmeter 49 in the order from the side of the branching portion 41.

The on-off valve 45 allows or blocks the flow of the discharge liquid discharged to the discharge pipe 37 of the washing process unit ONB1 and flowing into the recycling pipe 43. The pump 47 pressure-feeds the discharge liquid discharged to the discharge pipe 37 of the washing process unit ONB1 from the recycling pipe 43 to the supply pipe 25 of the washing process unit ONB2. The flowmeter 49 measures the flow rate of the discharge liquid flowing through the recycling pipe 43. The flow rate measured by the flowmeter 49 is output to the control unit 15. The recycling pipe 43 supplies the discharge liquid used in the washing process unit ONB1 and discharged to the outer tank 21 to the washing process unit ONB2.

The washing process unit ONB2 includes a recycling pipe 53. One end of the recycling pipe 53 is communicably connected to the branching portion 41 of the washing process unit ONB2. The other end of the recycling pipe 53 is communicably connected to the supply pipe 25 of the washing process unit ONB1. Specifically, the other end of the recycling pipe 53 is communicably connected between the flowmeter 33 and the ejection pipe 23 of the washing process unit ONB1. The recycling pipe 53 includes an on-off valve 55, a pump 57, and a flowmeter 59 in the order from the side of the branching portion 41.

The on-off valve 55 allows or blocks the flow of the discharge liquid discharged to the discharge pipe 37 of the washing process unit ONB2 and flowing into the recycling pipe 53. The pump 57 pressure-feeds the discharge liquid discharged to the discharge pipe 37 of the washing process unit ONB2 from the recycling pipe 53 to the supply pipe 25 of the washing process unit ONB1. The flowmeter 59 measures the flow rate of the discharge liquid flowing through the recycling pipe 53. The flow rate measured by the flowmeter 59 is output to the control unit 15. The recycling pipe 53 supplies the discharge liquid used in the washing process unit ONB2 and discharged to the outer tank 21 to the washing process unit ONB1.

Note that the processing tank 17 of the washing process unit ONB1 corresponds to a "first processing tank" in the present invention, and the processing tank 17 of the washing process unit ONB2 corresponds to a "second processing tank" in the present invention. The supply pipe 25 of the washing process unit ONB1 corresponds to a "first pure water supply pipe" in the present invention, and the supply pipe 25 of the washing process unit ONB2 corresponds to a "second pure water supply pipe" in the present invention. The flow rate regulating valve 29 and the on-off valve 31 of the washing process unit ONB1 correspond to a "first supply valve" in the present invention, and the flow rate regulating valve 29 and the on-off valve 31 of the washing process unit ONB2 correspond to a "second supply valve" in the present invention. The recycling pipe 43 corresponds to a "first recycling pipe" in the present invention, and the recycling pipe 53 corresponds to a "second recycling pipe" in the present invention. The on-off valve 45 corresponds to a "first recycling valve" in the present invention, and the on-off valve 55 corresponds to a "second recycling valve" in the present invention.

The inner tank 19 of the washing process unit ONB1 corresponds to a "first inner tank" in the present invention, and the inner tank 19 of the washing process unit ONB2 corresponds to a "second inner tank" in the present invention. The ejection pipe 23 of the washing process unit ONB1 corresponds to a "first ejection pipe" in the present invention, and the ejection pipe 23 of the washing process unit ONB2 corresponds to a "second ejection pipe" in the present invention. The outer tank 21 of the washing process unit ONB1 corresponds to a "first outer tank" in the present invention, and the outer tank 21 of the washing process unit ONB2 corresponds to a "second outer tank" in the present invention.

In a normal washing process in which recycling is not performed as described later, the control unit 15 operates each unit as follows, for example.

The control unit 15 closes the on-off valves 45 and 55. The control unit 15 opens the on-off valve 39. In this state, the control unit 15 operates the flow rate regulating valve 29 to set the flow rate of the pure water flowing through the supply pipe 25 to be a flow rate of a target value of a supply amount defined in the recipe. The control unit 15 opens the on-off valve 31. As a result, the pure water is supplied to the inner tank 19, and the washing process is performed on the substrate W immersed in the inner tank 19 in the washing process unit ONB1 (ONB2).

At this time, the control unit 15 preferably monitors the flow rate of the flowmeter 33, and if there is a difference from the target value of the supply amount defined in the recipe, operates the flow rate regulating valve 29 so as to eliminate the difference. That is, when pure water is supplied, the control unit 15 preferably performs feedback control so that the flow rate of the supply amount of the pure water matches the target value.

2. Specific Resistance Value During Washing Process

Figure 4:
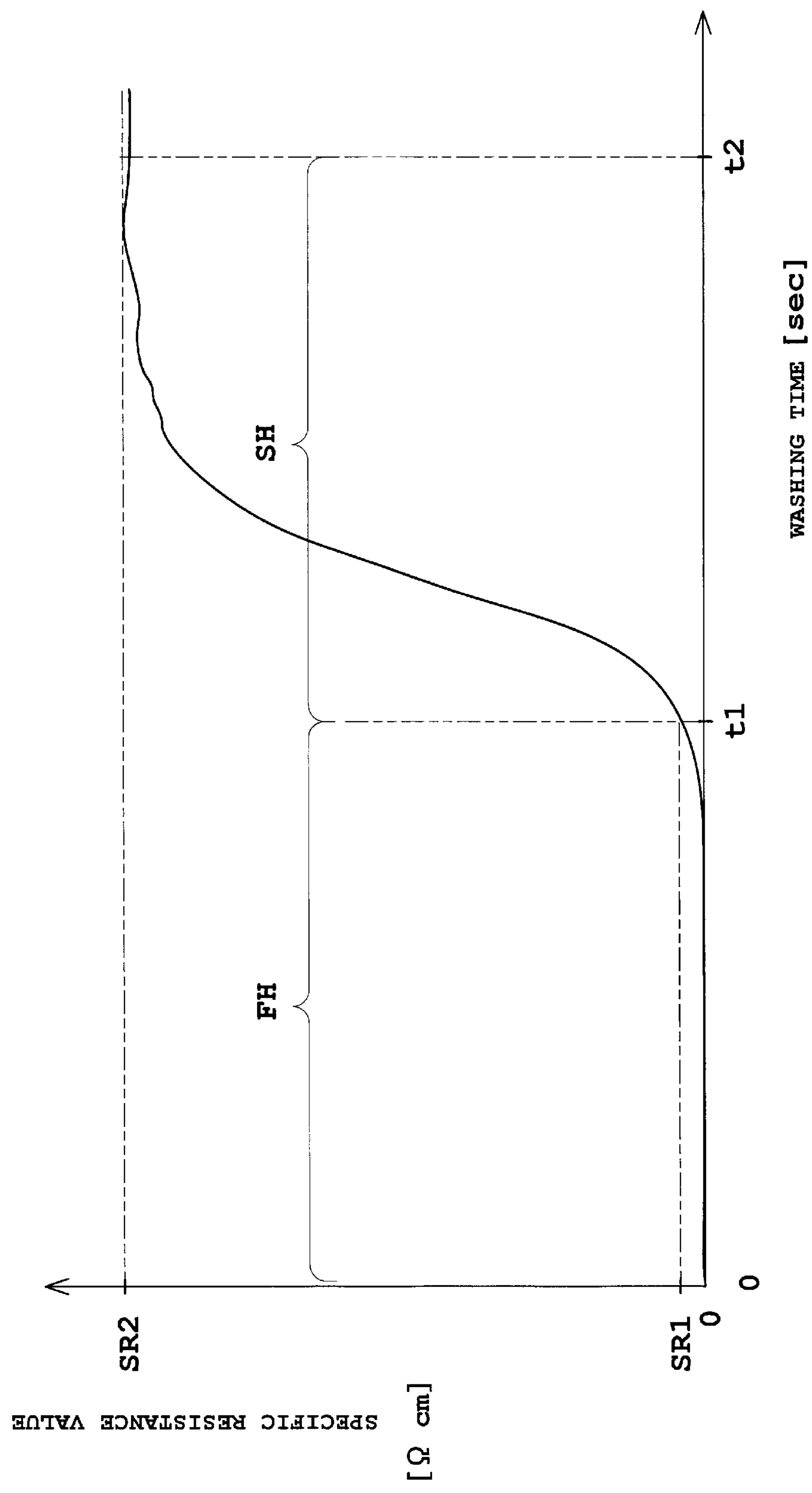
FIG. 4 is a graph illustrating an example of a change in a specific resistance value during washing process.

Reference is made to FIG. 4. FIG. 4 is a graph illustrating an example of a change in a specific resistance value during the washing process. In this graph, the vertical axis represents the specific resistance value [Ω·cm], and the horizontal axis represents a washing time [sec].

In the washing process unit ONB1 (ONB2), pure water is supplied from the pure water supply source 27 to the supply pipe 25. The pure water supplied from the supply pipe 25 is supplied from a pair of ejection pipes 23 toward a bottom surface of the inner tank 19. The pure water supplied toward a center of the bottom surface of the inner tank 19 merges and rises at the center of the inner tank 19, and rises along a surface of the substrate W. The pure water stored in the inner tank 19 overflows to the outer tank 21 beyond the upper edge of the inner tank 19. The pure water recovered in the outer tank 21 is discharged as a discharge liquid through the discharge pipe 37.

At this time, the graph of FIG. 4 illustrates an example of a change in the specific resistance value by the resistivity meter 35 when the substrate W that has been subjected to the chemical solution processing in the chemical solution processing unit CHB1 (CHB2) is immersed in the pure water of the washing process unit ONB1 (ONB2) to perform the washing process. For example, the control unit 15 does not refer to the output of the resistivity meter 35 at a time of washing process on the substrate W. For example, the control unit 15 controls the washing process in accordance with time to be time point t2 obtained in advance by an experiment in accordance with the chemical solution processing performed on the substrate W.

The control unit 15 controls ascending and descending of the sub transport mechanism LFS1 (LFS2). The control unit 15 operates the sub transport mechanism LFS1 (LFS2) to move the substrate W between an upper position above the inner tank 19 and a processing position inside the inner tank 19. The control unit 15 positions the substrate W at the processing position by the sub transport mechanism LFS1 (LFS2), and sets a time point at which the washing process with pure water is started as time point 0. For example, the specific resistance value becomes about SR1 at time point t1, and the specific resistance value is almost saturated to become SR2 at time point t2. Time point t2 is a time point at which the washing process with pure water ends.

Here, the specific resistance value SR2 is a theoretically maximum value of pure water supplied from the pure water supply source 27. The specific resistance value SR2 is, for example, 16 MΩ·cm. Specifically, the specific resistance value SR2 is a maximum value of the specific resistance value of pure water that can be produced by a pure water production device that supplies pure water to the pure water supply source 27.

The specific resistance value SR1 is, for example, 1 MΩ·cm. Alternatively, the specific resistance value SR1 is determined in a range of 0.5 MΩ·cm to 1 MΩ·cm in consideration of a final washing finish. From time point 0 to before time point t1, the washing process has been started, and an impurity concentration of the pure water stored in the inner tank 19 is high. At time point t1, the washing process has proceeded and impurities and the like are discharged from the inner tank 19, so that the impurity concentration of the pure water stored in the inner tank 19 starts to decrease rapidly and cleanliness is high. At time point t2, the washing process is completely finished, and the impurity concentration of the pure water stored in the inner tank 19 is almost zero, which is a clean state.

Here, time from time point 0 to time point t1 of the washing time with pure water is defined as a first half FH, and time from time point t1 to time point t2 is defined as a second half SH. The specific resistance value is significantly higher in the second half SH than in the first half FH. In other words, in the second half SH, the discharge liquid discharged from the inner tank 19 through the outer tank 21 has higher cleanliness than the discharge liquid in the first half FH.

Therefore, for example, when the washing process unit ONB1 starts the washing process before the washing process unit ONB2, the discharge liquid discharged from the outer tank 21 in the second half SH in the washing process unit ONB1 has a higher specific resistance value than the discharge liquid discharged from the outer tank 21 in the first half FH in the washing process unit ONB2. In other words, the discharge liquid discharged from the outer tank 21 in the second half SH in the washing process unit ONB1 has higher cleanliness than the discharge liquid discharged from the outer tank 21 in the first half FH in the washing process unit ONB2.

3. Operation of Control Unit

Figure 5:
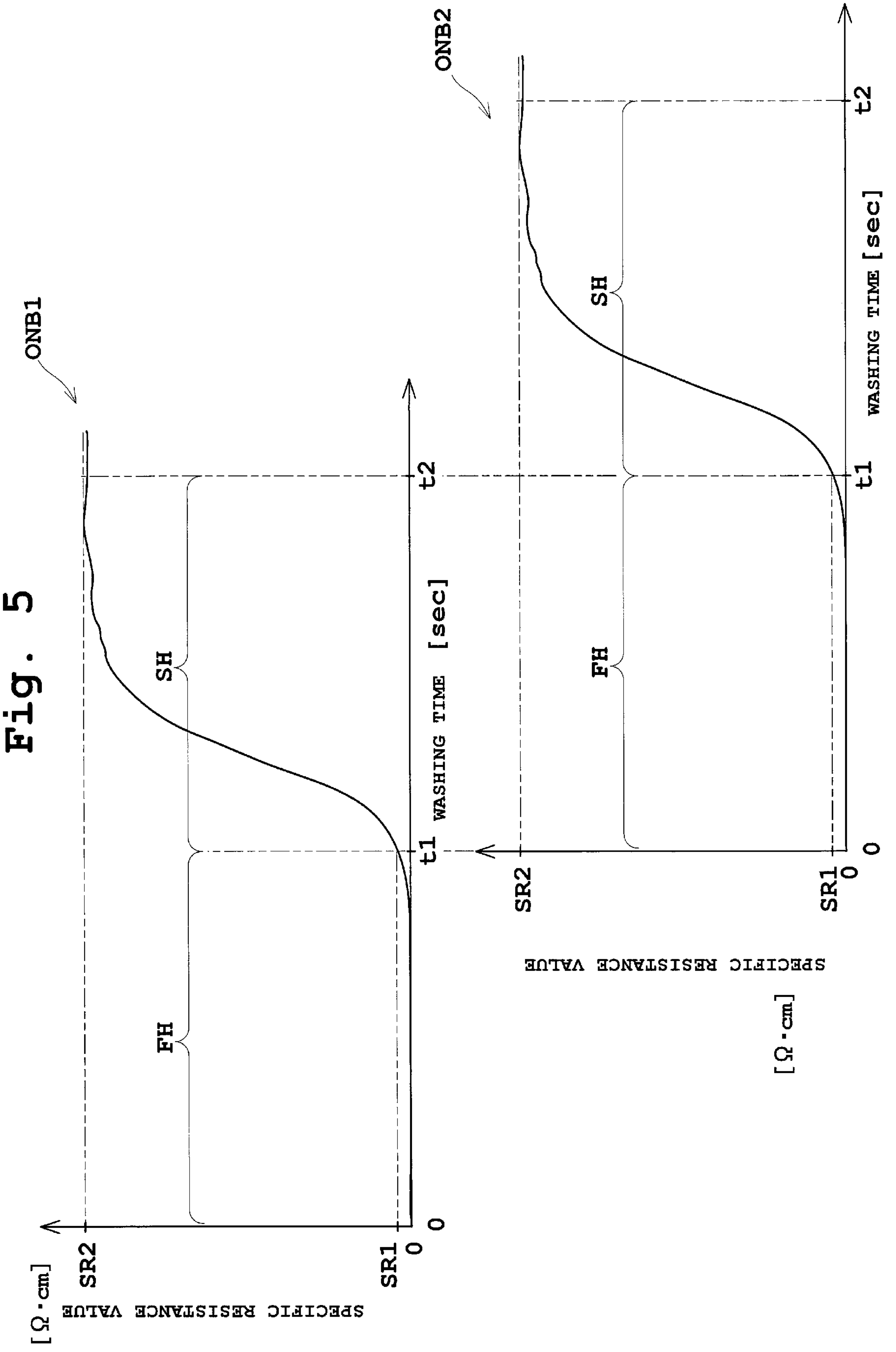
FIG. 5 is a graph for describing processing of superimposing a second half of washing process on a first half of another washing process.

Here, reference is made to FIG. 5. FIG. 5 is a graph for describing processing of superimposing the second half of washing process on the first half of another washing process.

For example, it is assumed that the washing process with pure water is first started in the washing process unit ONB1, and then the washing process with pure water is started in the washing process unit ONB2. In this case, the control unit 15 performs processing so that the second half SH in the washing process of the washing process unit ONB1 and the first half FH in the washing process of the washing process unit ONB2 overlap with each other. Alternatively, when the second half SH and the first half FH in the washing process at least partially overlap with each other in the washing process unit ONB1 that has started the washing process first and the washing process unit ONB2 that has started the washing process thereafter, the control unit 15 operates each unit so as to reuse the discharge liquid of the second half SH in the washing process unit ONB1 for the washing in the first half FH in the washing process unit ONB2,.

Specifically, when the discharge liquid can be reused for washing, the control unit 15 covers the pure water supplied from the supply pipe 25 to the inner tank 19 in the first half FH of the washing process unit ONB2 only with the discharge liquid of the recycling pipe 43.

The control unit 15 does not need to transfer each lot such that the second half SH in the washing process unit ONB1 (ONB2) and the first half FH in the washing process unit ONB2 (ONB1) completely overlap with each other. That is, the control unit 15 is only required to reuse the discharge liquid when at least a part of the second half SH of the washing process unit ONB1 (ONB2) and the first half FH in the washing process unit ONB2 (ONB1) overlap each other. As a result, at least a part of the discharge liquid in the second half SH in the washing process unit ONB1 (ONB2) can be reused.

When such recycling is performed, the control unit 15 preferably performs the following control.

For example, the control unit 15 does not supply the discharge liquid to the washing process unit ONB2 (ONB1) through the recycling pipe 43 (53) beyond the flow rate of the pure water supplied from the supply pipe 25 of the washing process unit ONB1 (ONB2) to the inner tank 19. In other words, the control unit 15 supplies the discharge liquid to the washing process unit ONB2 (ONB1) through the recycling pipe 43 (53) within the flow rate of the pure water supplied to the inner tank 19 of the washing process unit ONB1 (ONB2). It is therefore possible to prevent occurrence of an unstable supply state in the inner tank 19 to which the discharge liquid is supplied due to shortage of the discharge liquid to be recycled, which adversely affects the processing.

4. Processing of Lots

Figure 6:
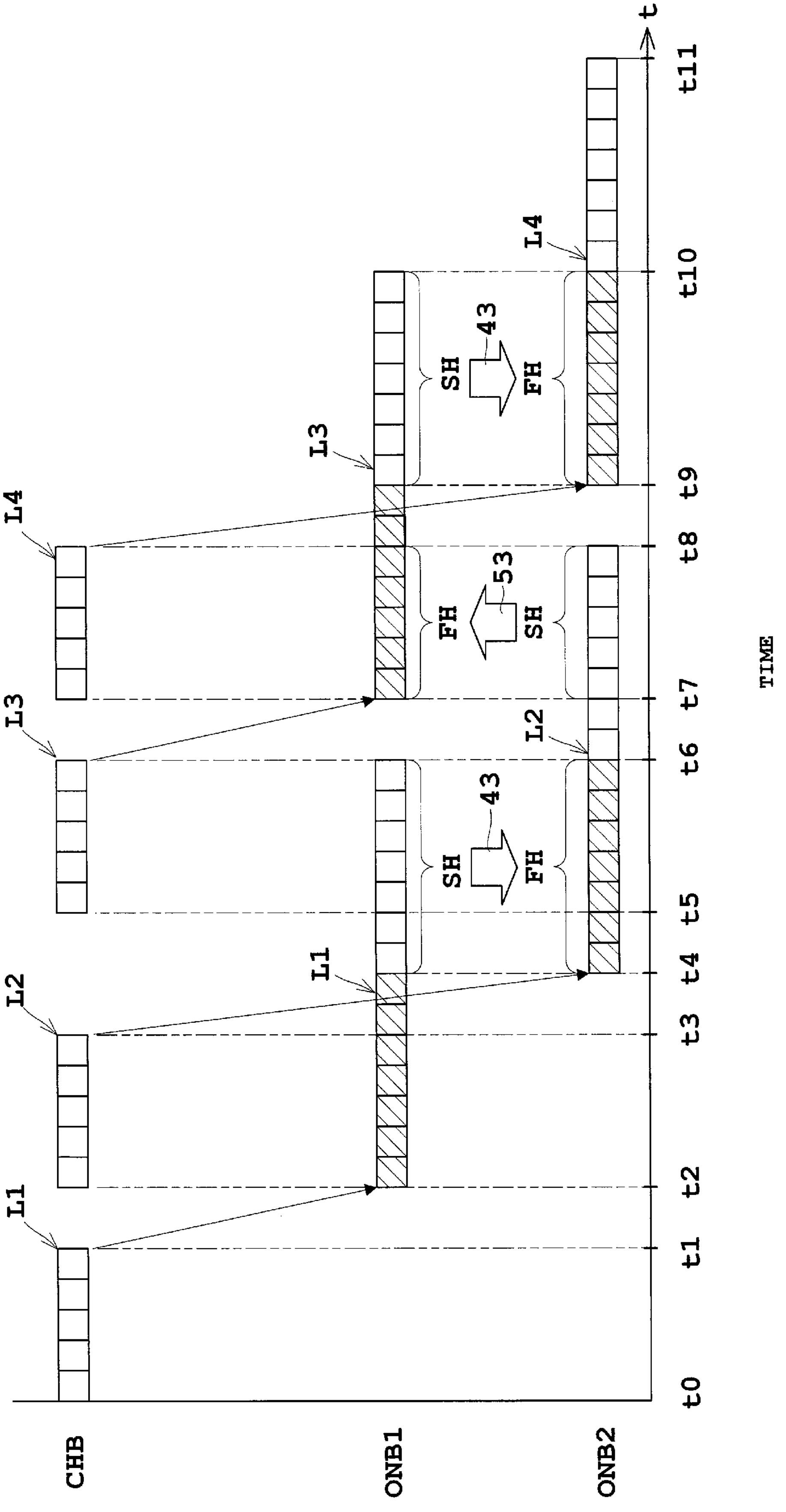
FIG. 6 is a time chart illustrating an example of processing four lots.

Here, reference is made to FIG. 6. FIG. 6 is a time chart illustrating an example of processing four lots.

In the following description, in order to facilitate understanding of the invention, a case where a plurality of or one substrate W is handled as one lot and processed by a substrate processing apparatus for each lot will be described as an example.

In the following description, a transfer system and the chemical solution processing unit CHB1 (CHB2) among resources to be operated by the control unit 15 are not limited. Therefore, for the sake of explanation, the chemical solution processing unit CHB1 (CHB2) is referred to as a chemical solution processing unit CHB, and the second transport mechanism WTR and the sub transport mechanism LFS1 (LFS2) are not described. As for the lot, as an example, a case where four lots are continuously processed will be described.

In FIG. 6, a first lot is represented by reference sign L1. Similarly, a second lot is denoted by reference sign L2, a third lot is denoted by reference sign L3, and a fourth lot is denoted by reference sign L4. The first to fourth lots L1 to L4 are introduced into the substrate processing apparatus in that order. In FIG. 6, as an example, a unit time of processing is indicated by one square. In FIG. 6, in the washing process with pure water, the first half FH is indicated by a hatched square, and the second half SH is indicated by a normal square.

Hereinafter, an example will be described in which the control unit 15 transfers the first to fourth lots L1 to L4 after the chemical solution processing by the chemical solution processing unit CHB and performs the washing process by the washing process units ONB1 and ONB2.

The control unit 15 processes the first lot L1 by the chemical solution processing unit CHB at time point t0. The chemical solution processing by the chemical solution processing unit CHB is completed at time point t1. The control unit 15 transfers the first lot L1 from time point t1 to time point t2, and transfers the first lot L1 to the washing process unit ONB1. The control unit 15 processes the first lot L1 by the washing process unit ONB1. The washing process with pure water is performed from time point t2 to time point t6.

Time from time point t2 to time point t6 corresponds to a "process of starting the washing process for the first lot" in the present invention.

The control unit 15 processes the second lot L2 by the chemical solution processing unit CHB from time point t2 to time point t3. The chemical solution processing of the second lot L2 by the chemical solution processing unit CHB is completed at time point t3. The control unit 15 transfers the second lot L2 at time point t3, and transfers the second lot L2 to the washing process unit ONB2. The control unit 15 processes the second lot L2 by the washing process unit ONB2. The washing process with pure water is performed from time point t4 to time point t8.

Time from time point t4 to time point t8 corresponds to a "process of starting the washing process for the second lot" in the present invention.

The control unit 15 starts processing the third lot L3 by the chemical solution processing unit CHB at time point t5. The chemical solution processing by the chemical solution processing unit CHB is completed at time point t6. The control unit 15 transfers the third lot L3 from time point t6 to time point t7, and transfers the third lot L3 to the washing process unit ONB1. The control unit 15 processes the third lot L3 by the washing process unit ONB1. The washing process with pure water is performed from time point t7 to time point t10.

Time from time point t7 to time point t10 corresponds to a "process of starting the washing process for the third lot" in the present invention.

The control unit 15 processes the fourth lot L4 by the chemical solution processing unit CHB from time point t7 to time point t8. The chemical solution processing of the fourth lot L4 by the chemical solution processing unit CHB is completed at time point t8. The control unit 15 transfers the fourth lot L4 at time point t8, and transfers the fourth lot L4 to the washing process unit ONB2. The control unit 15 processes the fourth lot L4 by the washing process unit ONB2. The washing process with pure water is performed from time point t9 to time point t11.

Next, when the first to fourth lots L1 to L4 are processed as described above, the reuse of the discharge liquid in the washing process units ONB1 and ONB2 will be described.

The first lot L1 subjected to the washing process by the washing process unit ONB1 and the second lot L2 subjected to the washing process by the washing process unit ONB2 are such that the entire second half SH of the first lot L1 and the entire first half FH of the second lot L2 completely overlap each other in time from time point t4 to time point t6.

5. Recycling Operation

<5.1 Recycling From Washing Process Unit ONB1 to Washing Process Unit ONB2>

At this time, the control unit 15 performs recycling from time point t4 to time point t6, for example, as follows.

That is, from time point t4 to time point t6, the control unit 15 recycles the discharge liquid discharged from the outer tank 21 of the washing process unit ONB1 to the discharge pipe 37 as follows.

Specifically, the control unit 15 opens the on-off valve 45 and activates the pump 47. As a result, the discharge liquid discharged from the discharge pipe 37 of the washing process unit ONB1 flows through the recycling pipe 43 and is supplied to the supply pipe 25 of the washing process unit ONB2. At this time, the control unit 15 monitors the output of from the flowmeter 49 of the recycling pipe 43. The control unit 15 preferably operates a liquid delivery amount in the pump 47 so that this output matches a target value of the flow rate defined in the recipe.

At time point t6, the control unit 15 closes the on-off valve 45 and stops the pump 47. Furthermore, the control unit 15 opens the on-off valve 31. The control unit 15 operates the flow rate regulating valve 29 so that the flow rate at the flowmeter 33 of the washing process unit ONB2 matches the target value of the flow rate defined in the recipe.

The second lot L2 subjected to the washing process by the washing process unit ONB2 and the third lot L3 subjected to the washing process by the washing process unit ONB1 are such that the entire second half SH of the second lot L2 and the entire first half FH of the third lot L3 overlap each other from time point t7 to time point t8.

<5.2 Recycling From Washing Process Unit ONB2 to Washing Process Unit ONB1>

The control unit 15 performs recycling from time point t7 to time point t8, for example, as follows.

That is, from time point t7 to time point t8, the control unit 15 recycles the discharge liquid discharged from the outer tank 21 of the washing process unit ONB2 to the discharge pipe 37 as follows. Specifically, the control unit 15 opens the on-off valve 55 and activates the pump 57. As a result, the discharge liquid discharged from the discharge pipe 37 of the washing process unit ONB2 flows through the recycling pipe 53 and is supplied to the supply pipe 25 of the washing process unit ONB1. At this time, the control unit 15 monitors the output of from the flowmeter 59 of the recycling pipe 53. The control unit 15 preferably operates a liquid delivery amount in the pump 57 so that this output matches a target value of the flow rate defined in the recipe.

<5.3 Recycling From Washing Process Unit ONB1 to Washing Process Unit ONB2>

The control unit 15 performs recycling from time point t9 to time point t10 as in <5.1 Recycling from washing process unit ONB1 to washing process unit ONB2>. That is, the discharge liquid is supplied from the washing process unit ONB1 to the washing process unit ONB2 through the recycling pipe 43.

As described above, when four lots of the first to fourth lots L1 to L4 are sequentially processed, pure water can be saved as follows as compared with normal washing process in which pure water is not recycled. Here, a saved amount is simply described by the number of squares each representing the unit time of the processing. During the processing of the second lot L2, the recycling pipe 43 can save pure water for "seven unit time". During the processing of the third lot L3, the recycling pipe 53 can save pure water for "five unit time". During the processing of the fourth lot L4, the recycling pipe 43 can save pure water for "seven unit time". That is, pure water for "19 unit time" can be saved in total.

In the present embodiment, the control unit 15 controls the on-off valve 31 and the flow rate regulating valve 29 of the washing process unit ONB1 and the washing process unit ONB2 and the on-off valves 45 and 55 of the recycling pipes 43 and 53 to supply the discharge liquid used in the second half SH of the washing process in the washing process unit ONB1 to the washing process unit ONB2 and to supply the discharge liquid used in the second half SH of the washing process in the washing process unit ONB2 to the washing process unit ONB1. Since the discharge liquid used in the washing process unit ONB1 is reused in the washing process unit ONB2 and the discharge liquid used in the washing process unit ONB2 is reused in the washing process unit ONB1, the supply amount of pure water from the supply pipe 25 to the washing process unit ONB1 and the washing process unit ONB2 can be reduced. Therefore, by recycling the pure water, a consumption amount of the pure water in the washing process can be reduced.

Modification 1

Figure 7:
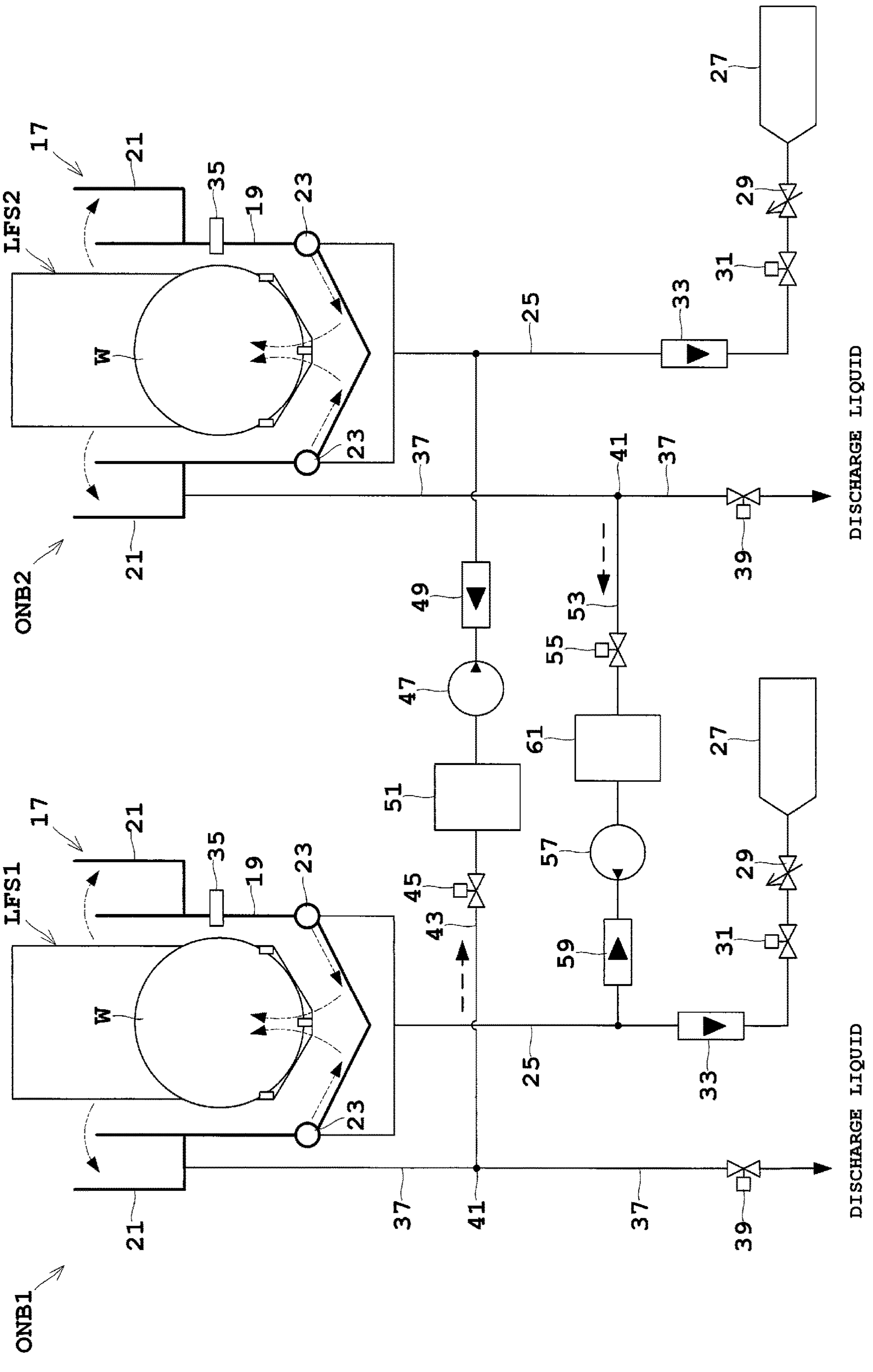
FIG. 7 is a diagram illustrating a modification of the washing process unit.

Reference is made to FIG. 7. FIG. 7 is a diagram illustrating a modification of the washing process unit.

The substrate processing apparatus according to Modification 1 is different from the above configuration in that the substrate processing apparatus includes buffer tanks 51 and 61.

Specifically, the recycling pipe 43 of the washing process unit ONB1 includes the buffer tank 51. The buffer tank 51 is disposed between the on-off valve 45 and the pump 47. The recycling pipe 53 of the washing process unit ONB2 includes the buffer tank 61. The buffer tank 61 is disposed between the on-off valve 55 and the pump 57.

The buffer tank 51 temporarily stores the discharge liquid discharged from the outer tank 21 of the washing process unit ONB1 to the discharge pipe 37 and flowing into the recycling pipe 43. The buffer tank 61 temporarily stores the discharge liquid discharged from the outer tank 21 of the washing process unit ONB2 to the discharge pipe 37 and flowing into the recycling pipe 53.

By providing the buffer tanks 51 and 61 in this manner, it is possible to provide a margin for a timing of recycling and supplying the discharge liquid. As a result, even when the second half SH of the lot introduced first and the first half FH of the lot introduced later are deviated in time from each other, the discharge liquid can be suitably reused.

A specific description will be given. Here, reference is made to FIG. 6. The second half SH of the second lot L2 is located from time point t6 to time point t8. The first half FH of the third lot L3 is located from time point t7 to time point t9. Therefore, in the configuration of the embodiment, only the discharge liquid from time point t7 to time point t8 can be reused in the second half SH of the second lot L2 (from time point t6 to time point t8).

Therefore, in the configuration of Modification 1, since the buffer tank 61 is provided, the discharge liquid at time points t6 to t7 in the second half SH of the second lot L2 can be temporarily stored in the buffer tank 61. As a result, all the discharge liquid in the second half SH of the second lot L2 can be reused in the first half FH of the third lot L2.

Modification 2

Figure 8:
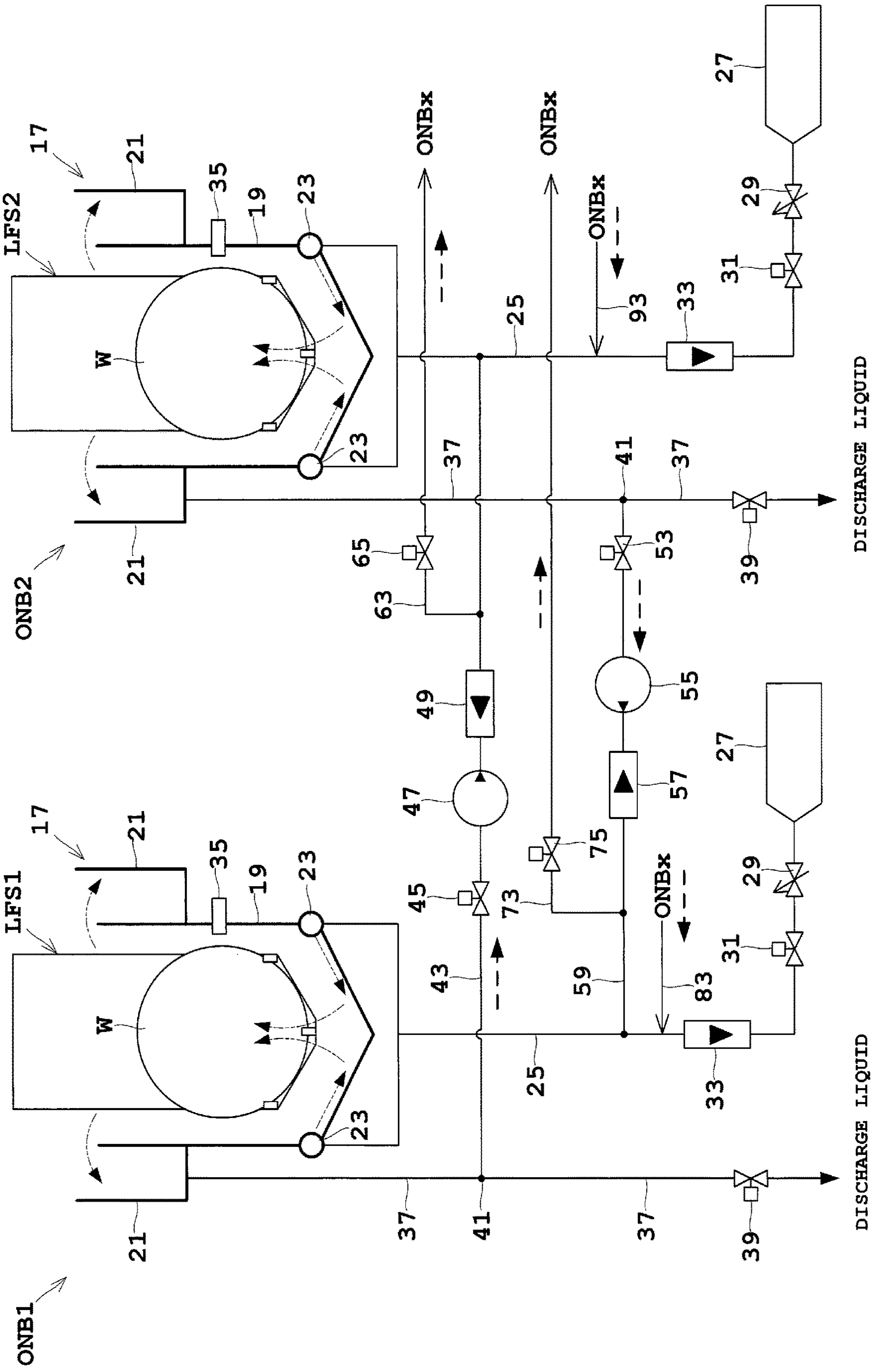
FIG. 8 is a diagram illustrating another modification of the washing process unit.

Reference is made to FIG. 8. FIG. 8 is a diagram illustrating another modification of the washing process unit.

In the above configuration, the substrate processing apparatus includes two washing process units of the washing process unit ONB1 and the washing process unit ONB2. Modification 2 illustrates an example of a configuration further including a washing process unit ONBx.

This configuration includes a recycling pipe 63 that has one end communicably connected to the recycling pipe 43 of the washing process unit ONB1. This configuration also includes a recycling pipe 73 that has one end communicably connected to the recycling pipe 53 of the washing process unit ONB2. The other ends of the recycling pipes 63 and 73 are communicably connected to a supply pipe of the washing process unit ONBx. The recycling pipe 63 includes an on-off valve 65. The on-off valve 65 allows or blocks the flow of the discharge liquid in the recycling pipe 63 from the washing process unit ONB1 through the recycling pipe 43. The recycling pipe 73 includes an on-off valve 75. The on-off valve 75 allows or blocks the flow of the discharge liquid in the recycling pipe 73 from the washing process unit ONB2 through the recycling pipe 53.

The washing process unit ONB1 includes a recycling pipe 83 that has one end communicably connected to the supply pipe 25. The washing liquid supply unit ONB2 includes a recycling pipe 93 that has one end communicably connected to the supply pipe 25. The other ends of the recycling pipes 83 and 93 are communicably connected to the discharge pipe 37 (not illustrated) of the washing process unit ONBx. The recycling pipes 83 and 93 include on-off valves (not illustrated). As a result, when the washing process unit ONBx is provided in addition to the washing process units ONB1 and ONB2, it is also possible to mutually reuse the discharge liquid from each unit.

The present invention is not limited to the above embodiment, and can be modified as follows.

(1) In the embodiment described above, the recycling pipe 43 and the recycling pipe 53 are provided, but the present invention is not limited to such a configuration. For example, only one of the recycling pipe 43 or the recycling pipe 53 may be provided. Such a configuration can also reduce the consumption amount of pure water of either one of the washing process unit ONB1 or the washing process unit ONB2.

(2) In the embodiment described above, a configuration including the transport mechanism such as the first transport mechanism CTC and the second transport mechanism WTR, the drying process unit LPD, and the like as illustrated in FIG. 1 has been described as an example. However, the present invention does not require such a configuration. That is, the present invention can be applied to any substrate processing apparatus including at least two washing process units ONB1 and ONB2.

(3) In the embodiment described above, the supply pipe 25 is configured to be able to supply only pure water. However, in the present invention, the supply pipe 25 may be provided with a mixing valve. The mixing valve includes a plurality of mixing valves, and can mix a plurality of types of chemical solutions in the supply pipe 25. When such a configuration is adopted, it is possible to supply only pure water, a processing liquid obtained by mixing a chemical solution with pure water, or a processing liquid including only a chemical solution by the supply pipe 25. The present invention can be also applied to such a configuration.

(4) In the embodiment described above, when the discharge liquid can be reused for washing, the pure water supplied from the supply pipe 25 to the inner tank 19 in the first half FH of the washing process unit ONB2 is covered only with the discharge liquid of the recycling pipe 43. However, the present invention is not limited to such a configuration.

That is, the control unit 15 controls the supply amount of the pure water in the supply pipe 25 of the washing process unit ONB2 and the supply amount of the pure water discharged from the discharge pipe 37 of the washing process unit ONB1 in the recycling pipe 43.

Specifically, a new liquid of pure water from the pure water supply source 27 of the washing process unit ONB2 and the discharge liquid from the recycling pipe 43 are appropriately mixed and supplied to the inner tank 19. More specifically, the control unit 15 operates the on-off valve 31 and the flow rate regulating valve 29 of the supply pipe 25 and the on-off valve 45 and the pump 47 of the recycling pipe 43 for the washing process unit ONB2. At this time, it is preferable to perform feedback control with reference to flow rates at the flowmeter 33 and the flowmeter 49. As a result, the control unit 15 can mix the discharge liquid of the second half SH in the washing process unit ONB1 with the pure water as the new liquid of the washing process unit ONB2 and reuse the mixture for washing in the first half FH in the washing process unit ONB2. Similarly, it is possible to mix the discharge liquid of the second half SH in the washing process unit ONB2 with the pure water as the new liquid of the washing process unit ONB1 and reuse the mixture for washing in the first half FH in the washing process unit ONB1.

As a result, by increasing a proportion of clean pure water, it can be expected to shorten the washing time while saving pure water.

When the above mixing is performed, the control unit 15 preferably operates each unit as follows.

That is, for example, the control unit 15 adjusts the flow rate regulating valve 29 of the washing process unit ONB2 performing the first half FH of the washing process, and considers the flow rate of the discharge liquid flowing in from the recycling pipe 43. That is, the control unit 15 operates the flow rate regulating valve 29 and the pump 47 for the washing process unit ONB2 performing the first half FH of the washing process so that the flow rate of the pure water supplied from the ejection pipe 23 to the inner tank 19 substantially matches the flow rate of the pure water in the first half FH or the second half SH in a case where the pure water is not recycled. When the second half SH of the washing process is performed by the washing process unit ONB1, the flow rate regulating valve 29 of the washing process unit ONB2 and the pump 47 of the recycling pipe 43 are operated so that the flow rate of the pure water supplied from the ejection pipe 23 of the washing process unit ONB2 to the inner tank 19 substantially matches the flow rate of the pure water supplied to the first half FH of the washing process unit ONB2 or the flow rate of the pure water supplied to the second half SH of the washing process unit ONB2 in a case where the pure water is not recycled.

Accordingly, in the first half FH and the second half SH of the washing process, it is possible to prevent the flow of pure water in the inner tank 19 from rapidly fluctuating and adversely affecting the substrate W processed at the processing position of the inner tank 19.

(5) In the embodiment described above, the recycling pipes 43 and 53 are communicably connected to the supply pipe 25. However, the present invention is not limited to such a configuration. The recycling pipes 43 and 53 may be configured to be communicably connected to the ejection pipe 23 and the inner tank 19.

(6) In the embodiment described above, the first half FH and the second half SH are divided at time point t1 when the specific resistance value SR1=0.5 MΩ·cm to 1 MΩ·cm. However, the present invention is not limited to such a form. That is, when the cleanliness of the substrate on the side to which the reusable discharge liquid is supplied is extremely lower than the cleanliness of the substrate on the side from which the reusable discharge liquid is supplied, the substrate may be divided into the first half FH and the second half SH at a time point when the specific resistance value SR1=a value lower than 0.5 MΩ·cm to 1 MΩ·cm. The specific resistance value SR1=0.5 MΩ·cm to 1 MΩ·cm is an example, and the present invention is not limited to this value.

(7) In the embodiment described above, a configuration in which the inner tank 19 includes the resistivity meter 35 has been described as an example. However, the present invention is not limited to such a configuration. For example, in place of the resistivity meter 35, a conductivity meter having higher sensitivity to 1 even with many impurities may be adopted than the resistivity meter 35. As a result, a degree of washing of the substrate W can be determined more accurately. Accordingly, the control unit 15 can accurately determine that the second half SH has been reached. Therefore, the control unit 15 may start the recycling in the second half SH on the basis of conductivity in the inner tank 19 instead of starting the recycling in the second half SH at a predetermined time. It is therefore possible to perform flexible processing according to the cleanliness without being limited to the time.

(8) In the embodiment described above, a case where four lots are processed has been described as an example. However, the present invention is not limited to processing in such a case. That is, the present invention has an effect when at least two lots are processed.

INDUSTRIAL APPLICABILITY

As described above, the present invention is suitable for a substrate processing apparatus that washes a substrate.

REFERENCE SIGNS LIST

W substrate
CTC first transport mechanism
WTR second transport mechanism
LPD drying process unit
11 first processing unit
ONB1 washing process unit
CHB1 chemical solution processing unit LFS1 sub transport mechanism
13 second processing unit
ONB2 washing process unit
CHB2 chemical solution processing unit
LFS2 sub transport mechanism
15 control unit
17 processing tank
19 inner tank
21 outer tank
23 ejection pipe
25 supply pipe
27 pure water supply pipe
29 flow rate regulating valve
31 on-off valve
33 flowmeter
35 specific resistance meter
37 discharge pipe
43, 53 recycling pipe
L1 to L4 first to fourth lots
FH first half
SH second half
51, 61 buffer tank

The invention claimed is:

1. A substrate processing apparatus that performs washing process on a substrate, the substrate processing apparatus comprising:

a first processing tank configured to accommodate the substrate;

a second processing tank configured to accommodate the substrate;

a first pure water supply pipe that is communicably connected to a pure water supply source and supplies pure water to the first processing tank;

a first supply valve inserted into the first pure water supply pipe;

a second pure water supply pipe that is communicably connected to the pure water supply source and supplies the pure water to the second processing tank;

a second supply valve inserted into the second pure water supply pipe;

a first recycling pipe that supplies a discharge liquid discharged from the first processing tank to the second processing tank;

a first recycling valve inserted into the first recycling pipe; and a control unit that controls opening and closing of the first supply valve, the second supply valve, and the first recycling valve and, wherein the second processing tank includes a second inner tank configured to accommodate the substrate, and a second outer tank into which the discharge liquid overflowing from an upper edge of the second inner tank flows and, wherein the second pure water supply pipe is communicably connected to the first recycling pipe.

2. The substrate processing apparatus according to claim 1, wherein the control unit manages the substrate to be subjected to the washing process in lots, and when a first lot is cleaned in the first processing tank and a second lot is cleaned in the second processing tank, at least a part of the discharge liquid discharged from the first processing tank in a second half of the washing process of the first lot is supplied to the second processing tank through the first recycling pipe in a first half of the washing process of the second lot.

3. The substrate processing apparatus according to claim 2, wherein the second half of the washing process of the first lot is at or after a time point at which a specific resistance value exceeds 0.5 MΩ·cm to 1 MΩ·cm from a start of the washing process.

4. The substrate processing apparatus according to claim 2, wherein the control unit does not supply the discharge liquid discharged from the first processing tank to the second processing tank and supplies the pure water from the second pure water supply pipe to the second processing tank in the second half of the washing process of the second lot.

5. The substrate processing apparatus according to claim 1, wherein the first recycling pipe includes a buffer tank.

6. The substrate processing method according to claim 1, wherein the second processing tank further includes a second ejection pipe that is provided at a bottom of the second inner tank and ejects the pure water upward, and wherein the second pure water supply pipe is communicably connected to the second ejection pipe and the first recycling pipe.

7. The substrate processing apparatus according to claim 1, further comprising:

a second recycling pipe that supplies the discharge liquid discharged from the second processing tank to the first processing tank; and a second recycling valve inserted into the second recycling pipe, wherein the first processing tank includes a first inner tank configured to accommodate the substrate, a first ejection pipe that is provided at a bottom of the first inner tank and ejects the pure water upward, and a first outer tank into which the discharge liquid overflowing from an upper edge of the first inner tank flows, the first pure water supply pipe is communicably connected to the first ejection pipe and the second recycling pipe.

8. The substrate processing apparatus according to claim 6, wherein the control unit manages the substrate to be subjected to the washing process in lots, and when a first lot is cleaned in the first processing tank and a second lot is cleaned in the second processing tank, at least a part of the discharge liquid discharged from the first processing tank in a second half of the washing process of the first lot is supplied to the second processing tank through the first recycling pipe in a first half of the washing process of the second lot, and at least a part of the discharge liquid discharged from the second processing tank in the second half of the washing process of the second lot is supplied to the first processing tank through the second recycling pipe in the first half of the washing process of a third lot that is subsequently processed in the first processing tank after the first lot.

9. The substrate processing apparatus according to claim 6, wherein the control unit supplies a mixture of at least a part of the discharge liquid discharged from the first processing tank and the pure water flowing through the second pure water supply pipe to the second processing tank in the first half of the washing process of the second lot, and supplies a mixture of at least a part of the discharge liquid discharged from the second processing tank and the pure water flowing through the first pure water supply pipe to the first processing tank in the first half of the washing process of the third lot.

* * * * *